(12) United States Patent
Watanabe et al.

(10) Patent No.: US 7,629,857 B2
(45) Date of Patent: Dec. 8, 2009

(54) SECOND HARMONIC OSCILLATOR

(75) Inventors: Shinsuke Watanabe, Tokyo (JP); Akira Inoue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 44 days.

(21) Appl. No.: 12/035,724

(22) Filed: Feb. 22, 2008

(65) Prior Publication Data

US 2009/0051448 A1 Feb. 26, 2009

(30) Foreign Application Priority Data

Aug. 23, 2007 (JP) ............................. 2007-217020

(51) Int. Cl.
*H03B 1/00* (2006.01)
(52) U.S. Cl. ............................. 331/76; 331/41; 331/43; 331/44; 331/107 R; 331/108 R; 331/74; 331/117 D
(58) Field of Classification Search .............. 331/41, 331/43, 44, 74, 76, 77, 117 D, 107 R, 108 R
See application file for complete search history.

(56) References Cited

U.S. PATENT DOCUMENTS

| 3,662,294 | A | * | 5/1972 | Jacobs et al. | 333/33 |
| 3,939,429 | A | * | 2/1976 | Lohn et al. | 455/255 |
| 4,096,453 | A | * | 6/1978 | Rogers | 331/117 D |
| 4,176,332 | A | * | 11/1979 | Bachert | 333/218 |
| 4,327,343 | A | * | 4/1982 | Cornish | 333/218 |
| 4,429,417 | A | * | 1/1984 | Yool | 455/291 |
| 4,479,260 | A | * | 10/1984 | Harrop | 455/333 |
| 4,491,976 | A | * | 1/1985 | Saitoh et al. | 455/315 |
| 4,707,669 | A | * | 11/1987 | Mekata et al. | 331/99 |
| 4,763,084 | A | * | 8/1988 | Pavio et al. | 331/56 |

(Continued)

FOREIGN PATENT DOCUMENTS

| JP | 8-23229 | 1/1996 |
| JP | 2001-111351 | 4/2001 |

OTHER PUBLICATIONS

Nakane at al., "Oscillator with Fundamental Load Appropriate for Second Harmonic Output", The Institute of Electronics, Information and Communication Engineers, General Conference, 2005, p. 49 with English summary.

(Continued)

*Primary Examiner*—Arnold Kinkead
*Assistant Examiner*—Richard Tan
(74) *Attorney, Agent, or Firm*—Leydig, Voit & Mayer, Ltd.

(57) ABSTRACT

A second harmonic oscillator has a series positive feedback configuration, suppresses output of a fundamental signal, and outputs a second harmonic signal having a frequency in a range from 1 GHz to 200 GHz generated inside of a circuit. The second harmonic oscillator includes: a transistor having a base terminal, a first emitter terminal, a second emitter terminal, and a collector terminal; a resonator circuit connected to the base terminal; a first transmission line shod-circuiting stub connected to one of the two emitter terminals; and a second transmission line short-circuiting stub connected to the other of the two emitter terminals and having a line length obtained by adding one-fourth of one wavelength of the fundamental signal to an integer multiple of one-half wavelength of the fundamental signal.

12 Claims, 6 Drawing Sheets

U.S. PATENT DOCUMENTS

| | | | | |
|---|---|---|---|---|
| 4,906,946 | A * | 3/1990 | Mekata et al. | 331/99 |
| 4,977,379 | A * | 12/1990 | Kielmeyer | 331/56 |
| 5,119,099 | A * | 6/1992 | Haruyama et al. | 342/51 |
| 5,164,686 | A * | 11/1992 | Shiga | 331/99 |
| 5,231,361 | A * | 7/1993 | Smith et al. | 331/56 |
| 5,289,139 | A * | 2/1994 | Fiedziuszko et al. | 331/56 |
| 5,392,014 | A * | 2/1995 | Nishida et al. | 333/218 |
| 5,402,087 | A * | 3/1995 | Gorczak | 331/117 D |
| 5,406,237 | A * | 4/1995 | Ravas et al. | 333/218 |
| 5,596,325 | A * | 1/1997 | Maas | 342/28 |
| 5,847,620 | A * | 12/1998 | Wong et al. | 331/117 D |
| 6,066,997 | A * | 5/2000 | Matsugatani et al. | 333/218 |
| 6,259,332 | B1 * | 7/2001 | Hosoya | 331/96 |
| 6,369,675 | B2 * | 4/2002 | Yamada | 333/218 |
| 2004/0233005 | A1 * | 11/2004 | du Toit | 331/107 SL |
| 2005/0227638 | A1 * | 10/2005 | Suematsu et al. | 455/118 |
| 2007/0164830 | A1 * | 7/2007 | Aikawa et al. | 331/107 SL |
| 2008/0143447 | A1 * | 6/2008 | Watanabe et al. | 331/46 |

OTHER PUBLICATIONS

Sanagi et al., "Input Networks to the Gate Terminal of Fets for Efficient Second Harmonic Generation", The Institute of Electronics, Information and Communication Engineers, General Conference, 2007, p. 47 with English summary.

Thomas et al., "Optimization of Active Microwave Frequency Multiplier Performance Utilizing Harmonic Terminating Impedances", IEEE Transactions on Microwave Theory and Techniques, vol. 44, No. 12, Dec. 1996.

Ryu et al., "Phase Noise Optimization of CMOS VCO Through Harmonic Tuning", IEEE RFIC, 2005.

* cited by examiner 14.94 [dBm]

17.93 [dBm]

15.32 [dBm]

15.61 [dBm]

15.33 [dBm]

SECOND HARMONIC OSCILLATOR

BACKGROUND OF THE INVENTION

1. Field of the Invention

The present invention relates to a second harmonic oscillator that operates mainly in a microwave or millimeter wave domain.

2. Description of the Related Art

Along with the widespread of consumer radars such as an on-vehicle radar and a cellular phone, a demand for downsizing an oscillator whose output frequency exceeds 1 GHz and enhancing the performance of the oscillator has been increased. The "oscillator" refers to a circuit that oscillates an electric signal in the interior of the circuit and transmits the electric signal to the external.

In a fundamental harmonic oscillator, in a case where an electric signal having a desired frequency is generated with excellent characteristics (high output, low phase noise), it is necessary for a transistor to have a sufficient gain at the desired frequency. However, the gain of the transistor generally decreases as the frequency becomes higher. Therefore, the harmonic oscillator is generally used. The "harmonic oscillator" refers to an oscillator that oscillates an electric signal that is a factor of an integer of the desired frequency, and takes out a harmonic signal from an output terminal. In the harmonic oscillator, a demand for the high frequency characteristics with respect to the transistor is not severe as compared with a fundamental harmonic oscillator. Thus, an oscillator having excellent characteristics can be obtained.

FIG. 5 is a diagram showing the configuration of a related art second harmonic oscillator. In FIG. 5, a matching circuit 4 reflects a fundamental harmonic signal from a transistor 1 toward an output terminal 5, and takes out a second harmonic signal to the external. In the case of the second harmonic oscillator, there is a circuit using a leading end open stab having a line length corresponding to one-fourth of the wavelength of the fundamental harmonic signal as an example of the matching circuit 4 (for example, refer to "A low Phase Noise 19 GHz-band VCO using Two Different Frequency Resonators," IEEE MTT-S Int. Microwave Symp. Digest, pp. 2189-2191, 2003).

There is a push-push oscillator (for example, "A monolithic integrated 150 GHz SiGe HBT Push-Push VCO with simultaneous differential V-band output," IEEE MTT-S International. Microwave Symposium. Digest, pp. 877-880, 2003) as an oscillator that takes out a second harmonic signal besides the second harmonic oscillator using the above matching circuit 4.

Also, in a Colpitts harmonic oscillator of an emitter follower configuration having a low frequency (1 GHz or lower), there has been proposed installation of a circuit that comes to an open state at a fundamental frequency and a short-circuit state at a harmonic frequency to the emitter of the oscillator transistor as an approach to improve the harmonic output electric power (for example, refer to JP 08-23229 A). With the above configuration, there has been reported that the circuit blocks the feedback of the harmonic signal of the Colpitts harmonic oscillator, thereby making it possible to improve the harmonic output electric power.

The suppression of phase noise is required in an oscillator. In other words, it is required that the frequency spectrum of the output signal be sharp in a delta function fashion. In addition, in recent years, it is also required that the output power be high in addition to the low phase noise. This is because the number of stages of multistage amplifiers that are used to amplify the output power of the oscillator can be reduced by improving the output power of the oscillator that is used in a consumer radar or a cellular phone, and the low cost and the low power consumption are attained for the entire system thereby.

If there is no upper limit to the physical size of the oscillator, it is possible to produce an oscillator that is high in output and low in phase noise by an aid of a resonator that is large in physical size. Also, an approach of combining output powers of plural oscillators can be taken.

However, in many actual cases, the upper limit of the physical size of the oscillator is fixed to some extent. In the case where the physical size of the oscillator is fixed, most approaches to improve the output power deteriorate the phase noise.

SUMMARY OF THE INVENTION

The present invention has been made to solve the above problem, and therefore an object of the present invention is to provide a second harmonic oscillator which is capable of improving the output power without substantially changing the physical size of the entire circuit and without deteriorating the phase noise.

A second harmonic oscillator according to the present invention has a series positive feedback configuration, and suppresses an output of a fundamental harmonic signal to output a second waveform signal of from 1 GHz to 200 GHz which is generated in an interior of a circuit. The second harmonic oscillator includes: a transistor having a base terminal, a first emitter terminal, a second emitter terminal and a collector terminal; a resonator circuit that is connected to the base terminal; a first microwave line short-circuiting stab that is connected to one of the first emitter terminal and the second emitter terminal; and a second microwave line short-circuiting stab that is connected to the other one of the first emitter terminal and the second emitter terminal and has a second line length which is different from a first line length of the first microwave line short-circuiting stab.

The second harmonic oscillator according to the present invention is capable of improving the output power without substantially changing the physical size of the entire circuit and without deteriorating the phase noise.

DETAILED DESCRIPTION OF THE PREFERRED EMBODIMENTS

First Embodiment

Figure 1:
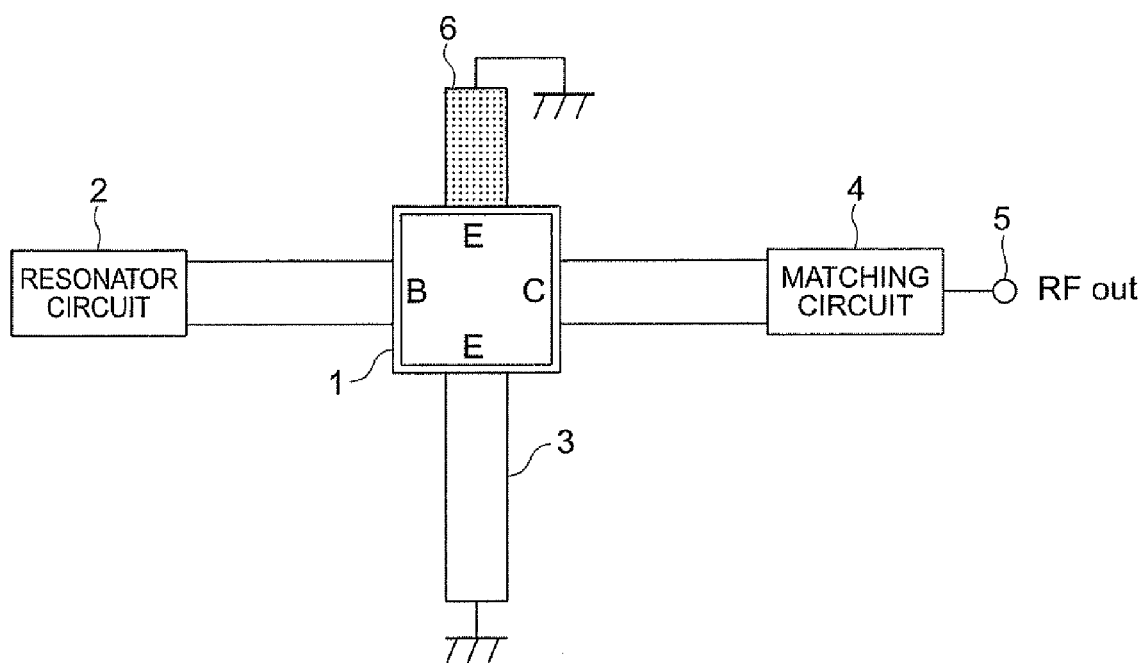
FIG. 1 is a diagram showing the configuration of a second harmonic oscillator according to a first embodiment of the present invention.

A second harmonic oscillator according to a first embodiment of the present invention will be described with reference to FIGS. 1 to 4. FIG. 1 is a diagram showing the configuration of the second harmonic oscillator according to the first embodiment of the present invention. In the respective drawings, the same symbols represent identical or corresponding parts.

Referring to FIG. 1, the second harmonic oscillator according to the first embodiment of the present invention is of a series positive feedback configuration, which includes a transistor 1 having two emitter terminals (E), a resonator circuit 2, a ground circuit 3, a matching circuit 4, an output terminal 5 of a signal, and a λ/4 short-circuiting stab 6.

In the case where the transistor 1 is a field effect transistor (FET), the emitter terminals (E), a base terminal (B), and a collector terminal (C) are replaced with a source terminal, a gate terminal, and a drain terminal, respectively.

Figure 6:
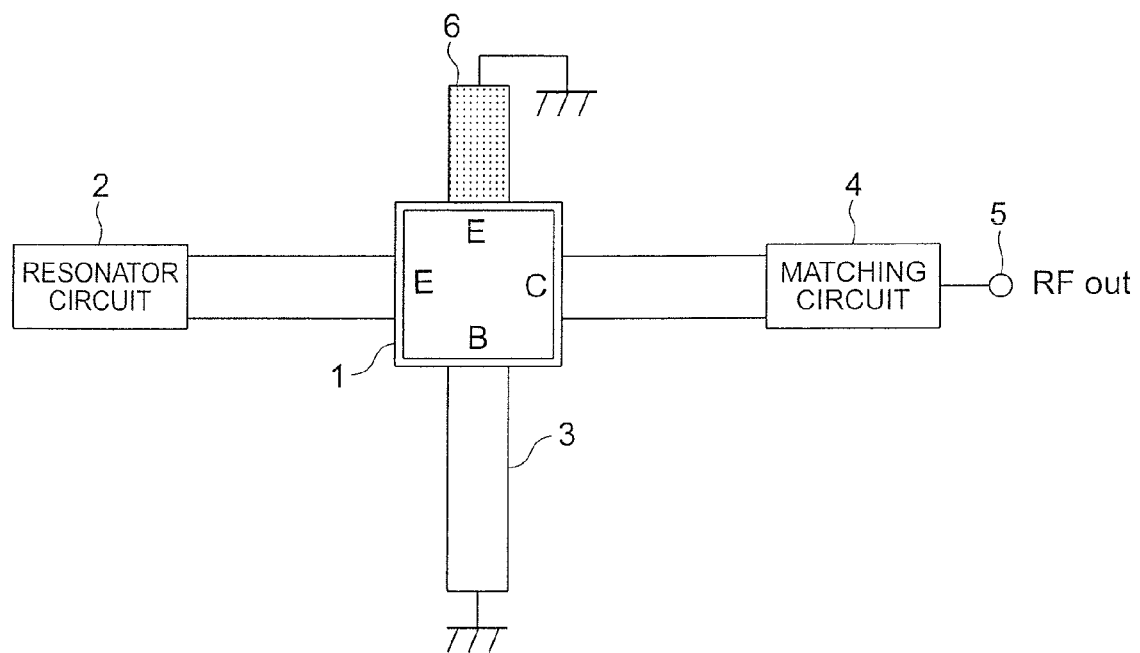
FIG. 6 is a diagram showing an alternative configuration of a second harmonic oscillator according to an embodiment of the present invention.

The resonator circuit 2 can be connected to the base terminal (B), or can be connected to any one of the two emitter terminals (E) as shown in FIG. 6.

The ground circuit 3 is a microwave line short-circuiting stab, and can be connected to any one of the two emitter terminals (E), or can be connected to the base terminal (B) contrarily to the resonator circuit 2, as shown in FIG. 6.

The λ/4 short-circuiting stab 6 is a microwave line short-circuiting stab having a line length obtained by adding one-fourth of the wavelength of the fundamental harmonic signal to the integral multiple of the half wavelength of the fundamental harmonic signal, and is connected to any one of the two emitter terminals (E).

A load impedance when the resonator circuit 2 is viewed from the input terminal of the transistor 1 is represented by Zb, a load impedance when the output terminal 5 is viewed from the output terminal of the transistor 1 is represented by Zc, and a load impedance when the ground is viewed from the emitter terminal (E) of the transistor 1 is represented by Ze. Also, the respective load impedances at the fundamental frequency (fundamental harmonic signal) are represented by $Zb(1f)$, $Zc(1f)$, and $Ze(1f)$, and the respective load impedances at the second harmonic frequency (second harmonic signal) are represented by $Zb(2f)$, $Zc(2f)$, and $Ze(2f)$.

Subsequently, the operation of the second harmonic oscillator according to the first embodiment of the present invention will be described with reference to the accompanying drawings.

As a result of a circuit analysis and the circuit simulation, it has been found that the output power of the second harmonic oscillator having the series positive feedback configuration strongly depends on the load impedance $Ze(2f)$. In particular, it has been found that the load impedance $Ze(2f)$ is set in the vicinity of short-circuiting to obtain the maximum value of the output power. In order to conduct the positive feedback of the fundamental harmonic signal, the load impedance $Ze(1f)$ is required to be designed to be an impedance other than short-circuiting. In this situation, the load impedance $Ze(2f)$ generally becomes an impedance other than the short-circuiting.

Under the circumstances, there is added the λ/4 short-circuiting stab 6 that converts only the load impedance $Ze(2f)$ into the impedance in the vicinity of the short-circuiting while the load impedances $Zb(1f)$, $Zc(1f)$, and $Ze(1f)$ are kept to constant values (the microwave line short-circuiting stab having a line length obtained by adding one-fourth of the wavelength of the fundamental harmonic signal to the integral multiple of the half wavelength of the fundamental harmonic signal). As a result, it is possible to improve the output power without deteriorating the phase noise.

In the Colpitts harmonic oscillator described in the description of a related art, there has been proposed the installation of a circuit to the emitter of the oscillator transistor, which comes to an open state at a fundamental frequency and a short-circuit state at the harmonic frequency. This time, similarly, there has been found that the installation of the circuit that comes to the short-circuiting state at the second harmonic frequency such as the λ/4 short-circuiting stab to the emitter is useful. However, in the case where the same manner as the above manner proposed for the Colpitts harmonic oscillator is used in an oscillator that is high in output frequency (1 GHz or higher), the λ/4 short-circuiting stab must be attached just proximal to the emitter terminal for the purpose of setting the load impedance $Ze(2f)$ to be an impedance in the vicinity of the short-circuiting. When plural circuits or lines are attached just proximal to one emitter terminal in the oscillator that is high in output frequency, it is anticipated to deteriorate the characteristic of the oscillator adversely because the lines in the periphery of the transistor interfere with each other.

Under the circumstances, in many transistors, the provision of two or more emitters is utilized in the following manner. That is, the ground circuit 3 for setting the load impedance $Ze(1f)$ is connected to one emitter terminal, and the λ/4 short-circuiting stab for setting the load impedance $Ze(2f)$ is connected to another emitter terminal, thereby making it possible to reduce the interference of the lines in the periphery of the transistor 1 with each other.

The λ/4 short-circuiting stab 6 functions to be open with respect to the fundamental harmonic signal (functions in the same manner as that where nothing is added). Accordingly, it is possible to change the load impedance $Ze(2f)$ without changing the load impedance $Ze(1f)$ by the aid of the connection of the λ/4 short-circuiting stab 6.

Figure 5:
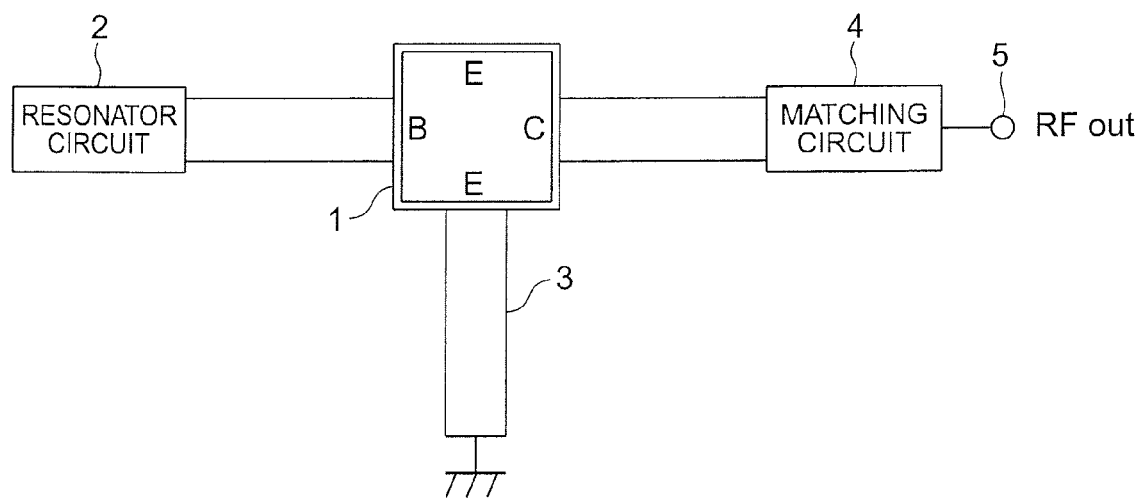
FIG. 5 is a diagram showing the configuration of a conventional second harmonic oscillator.

In order to exhibit the advantages obtained by connecting the λ/4 short-circuiting stab 6 using the simulation of the oscillation characteristic of the second harmonic oscillator having the series positive feedback shown in FIG. 5, its calculation example will be described.

Figure 2A:
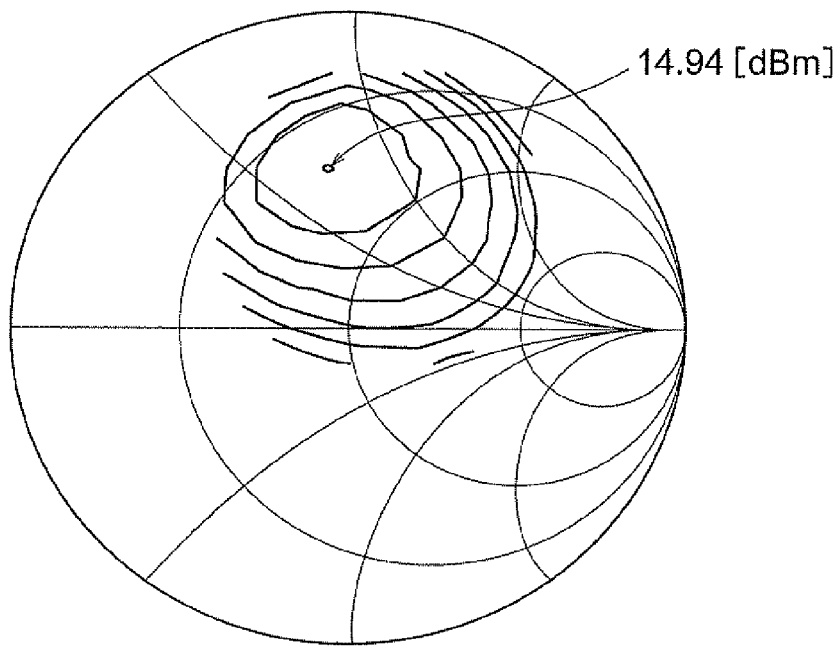
FIGS. 2A and 2B are diagrams showing the output power load-pull simulation results of the second harmonic oscillator having a series positive feedback configuration when a load impedance $Z_e(2f)$ changes.
Figure 2B:
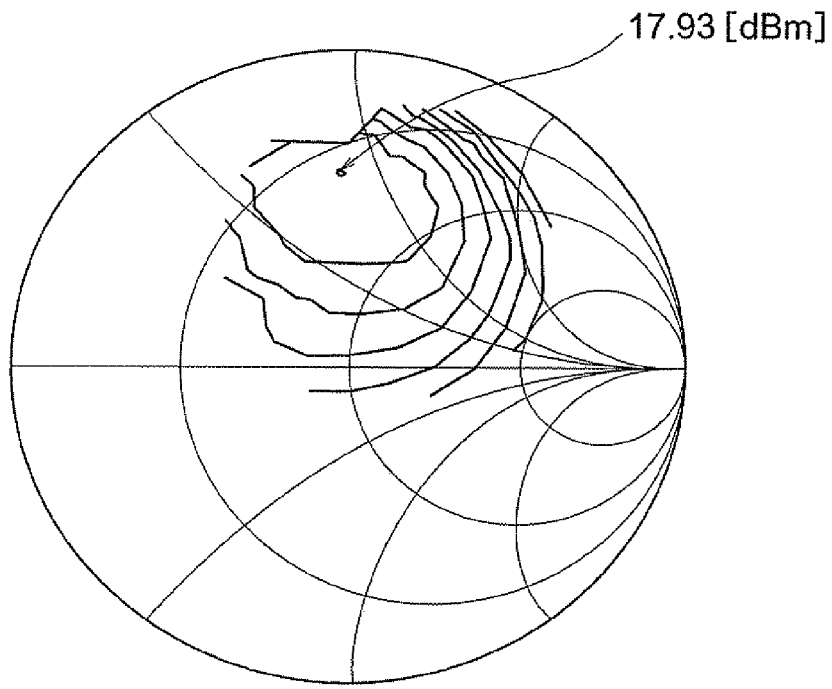

FIGS. 2A and 2B are diagrams showing the output power load-pull simulation results of the second harmonic oscillator having a series positive feedback configuration when the load impedance $Ze(2f)$ changes. FIG. 2A shows a case of $Ze(2f)=17.35-j144.05$ [Ω], and FIG. 2B shows a case of $Ze(2f)=0$ [Ω].

The load impedances $Zb(1f)$, $Zc(1f)$ and $Ze(1f)$ are set so as to satisfy the fundamental frequency $1f=19.9$ GHz and the second harmonic frequency $2f=39.8$ GHz. In order to obtain the sufficient positive feedback at the fundamental frequency $1f=19.9$ GHz, the line length between the ground terminal (emitter terminal) of the transistor 1 and the ground is set to 2190 μm. In this situation, the load impedance $Ze(2f)$ is $Ze(2f)=17.35-j144.05$ [Ω] which is largely different from $Ze(2f)=0$ (short-circuiting).

FIG. 2A shows the simulation results of the output power when the load impedance $Zc(2f)$ changes in the above conventional second harmonic oscillator by contour at intervals of 0.5 dB. In the case where the second harmonic impedance matching of the matching circuit 4 at the output side is conducted, and the load impedance $Zc(2f)$ is optimized, the output power of 14.94 dBm at the maximum is obtained as the calculation result.

Subsequently, with the connection of the λ/4 short-circuiting stab 6, the same simulation as that described above is conducted by setting the load impedance Ze(2f) in the vicinity of the short-circuiting without changing the load impedance Ze(1f). The results are shown in FIG. 2B. The load impedance Ze(2f) is set in the vicinity of the short-circuiting, to thereby obtain the calculation results that improve the maximum value of the output power to 17.93 dbm.

Even if the λ/4 short-circuiting stab 6 is connected, the fundamental impedance that dominantly determines the oscillation frequency and the phase noise does not change. Accordingly, there is neither variation in oscillation frequency nor increase of the phase noise, which is caused by the connection of the λ/4 short-circuiting stab 6.

Figure 3B:
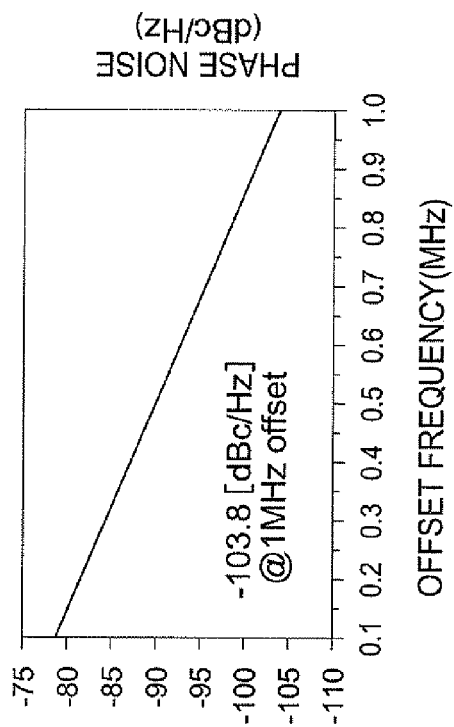
FIGS. 3A to 3D are diagrams showing the spectrum and phase noise simulation results of the second harmonic oscillator having a series positive feedback configuration when the load impedance $Z_e(2f)$ changes.
Figure 3D:
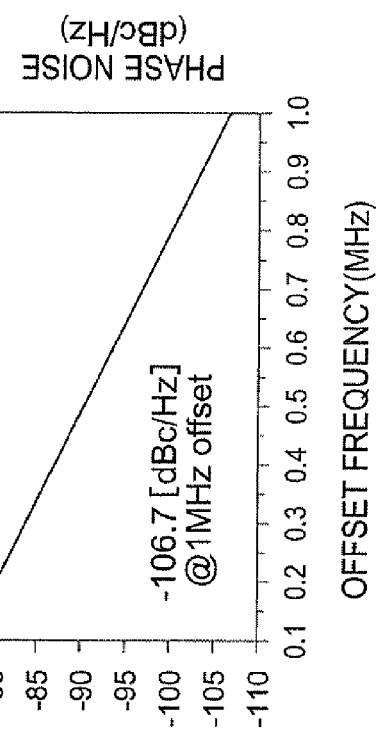
Figure 3A:
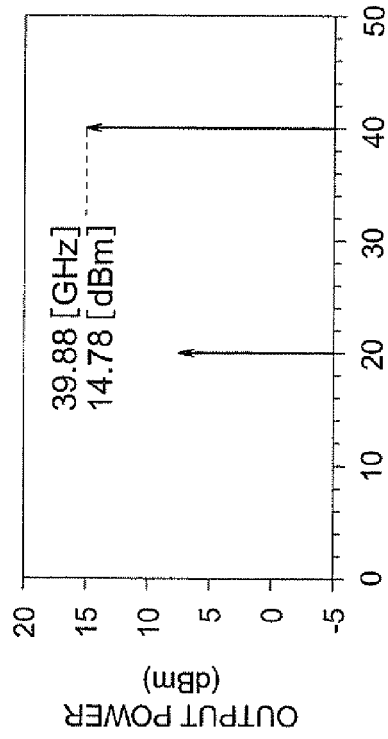
Figure 3C:
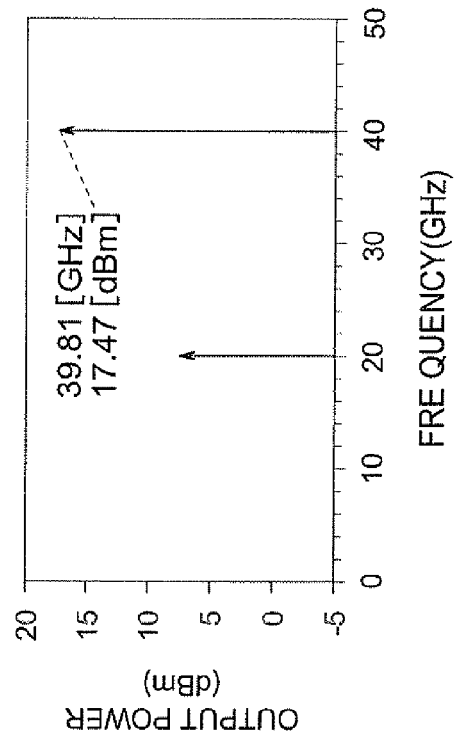

FIGS. 3A and 3B are diagrams showing the spectrum and output power load-pull simulation results of the second harmonic oscillator having the series positive feedback configuration when the load impedance Ze(2f) changes. FIG. 3A shows a case of Ze(2f)=17.35−j144.05 [Ω] and FIG. 3B shows a case of Ze(2f)=0 [Ω].

In other words, FIG. 3A shows the simulation results before the λ/4 short-circuiting stab 6 is connected, and FIG. 3B shows the simulation results after the λ/4 short-circuiting stab 6 is connected. It is found that the connection of the λ/4 short-circuiting stab 6 does not cause a variation in the oscillation frequency or an increase in the phase noise.

As is understood from a comparison of the conventional series positive feedback second harmonic oscillator (FIG. 5) with the first embodiment of the present invention (FIG. 1), the added circuit is only the λ/4 short-circuiting stab 6, and the physical size of the oscillator does not substantially change.

Figure 4A:
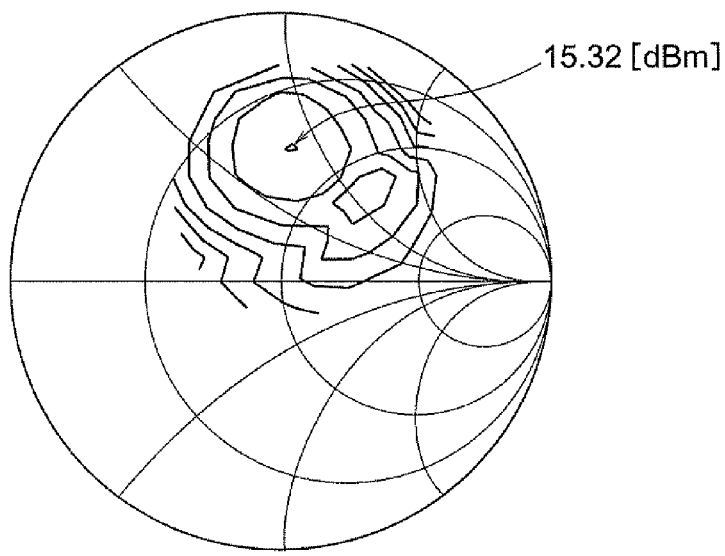
FIGS. 4A to 4C are diagrams showing the output power load-pull simulation results of the second harmonic oscillator having a series positive feedback configuration at the time of the load impedance $Z_e(2f)$.
Figure 4B:
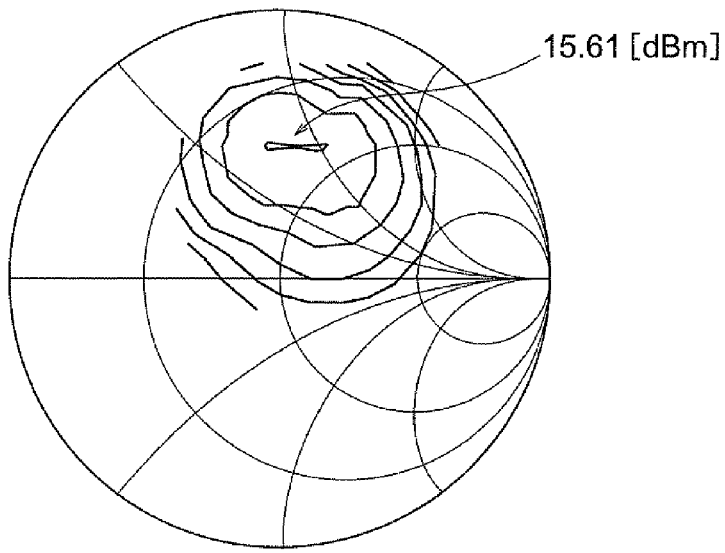
Figure 4C:
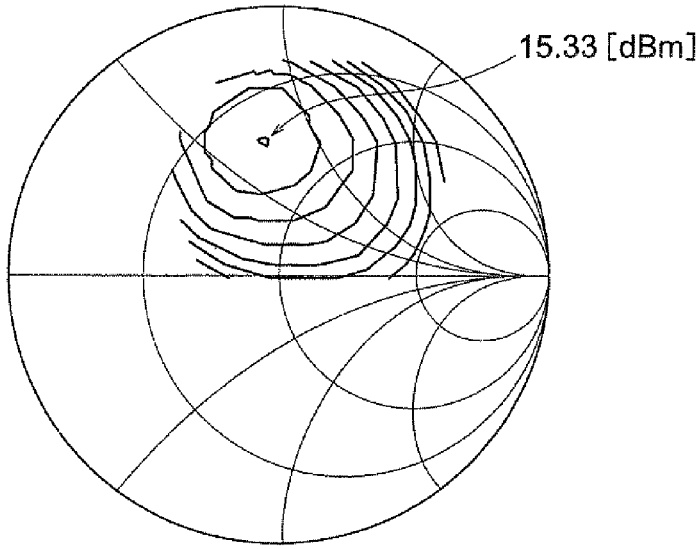

FIGS. 4A to 4C are diagrams showing the output power load-pull simulation results of the second harmonic oscillator having a series positive feedback configuration at the time of the respective load impedances Ze(2f). FIG. 4A shows a case of Ze(2f)=20[Ω], FIG. 4B shows a case of Ze(2f)=20+j20 [Ω], and FIG. 4C shows a case of Ze(2f)=20−j20 [Ω].

The load impedances Ze(2f) expect an improvement in the output power when a real part is in a range of from 0 to +20Ω, and an imaginary part is in a range of from −20 to +20Ω even though the load impedances are not strictly short-circuited, as shown in FIGS. 4A to 4C.

The λ/4 short-circuiting stab 6 is connected to another emitter terminal (E) different from the emitter terminal (E) that is connected to the ground circuit 3 among the emitter terminal (E) group of the transistor 1 in the second harmonic oscillator. As a result, it is possible to optimize the load impedance of the second harmonic signal which is viewed from the emitter terminal, and to suppress a change in the physical size of the entire circuit, the deterioration of the phase noise, and the interference of the lines in the periphery of the transistor with each other, thereby enabling an improvement in the output power of the second harmonic signal.

In other words, in the second harmonic oscillator according to the first embodiment of the present invention, the ground circuit 3 is connected to one of two emitter terminals of the transistor 1, and the λ/4 short circuiting stab 6 is connected to another emitter terminal, to thereby make it possible to improve the harmonic output power without changing the physical size of the oscillator and without deteriorating the phase noise.

Second Embodiment

Description will be made of a second harmonic oscillator according to a second embodiment of the present invention.

In the above first embodiment of the present invention, the λ/4 short-circuiting stab 6 that is open with respect to the fundamental harmonic signal has been described. Alternatively, it is possible to connect the microwave line short-circuiting stab that is not open with respect to the fundamental harmonic signal. In this case, it is necessary to redesign the load impedances of the fundamental harmonic signal of the ground circuit 3. For example, the length of the ground circuit 3 is changed.

What is claimed is:

1. A second harmonic oscillator that has a series positive feedback configuration, suppresses output of a fundamental signal, and outputs a second harmonic signal having a frequency in a range from 1 GHz to 200 GHz which is generated inside a circuit, comprising:
   a transistor having a base terminal, a first emitter terminal, a second emitter terminal, and a collector terminal;
   a resonator circuit that is connected to the base terminal;
   a first transmission line short-circuiting stub that has a first line length and that is connected to one of the first emitter terminal and the second emitter terminal; and
   a second transmission line short-circuiting stub that is connected to the other of the first emitter terminal and the second emitter terminal and that has a second line length which is different from the first line length of the first transmission line short-circuiting stub.

2. A second harmonic oscillator that has a series positive feedback configuration, suppresses output of a fundamental signal, and outputs a second harmonic signal having a frequency in a range from 1 GHz to 200 GHz which is generated inside a circuit, comprising:
   a transistor having a base terminal, a first emitter terminal, a second emitter terminal, and a collector terminal;
   a resonator circuit that is connected to one of the first emitter terminal and the second emitter terminal;
   a first transmission line short-circuiting stub that has a first line length and that is connected to the base terminal; and
   a second transmission line short-circuiting stub that is connected to the other of the first emitter terminal and the second emitter terminal and has a second line length which is different from the first line length of the first transmission line short-circuiting stub.

3. A second harmonic oscillator that has a series positive feedback configuration, suppresses an output of a fundamental signal, and outputs a second harmonic signal having a frequency in a range from 1 GHz to 200 GHz which is generated inside a circuit, comprising:
   a field effect transistor having a gate terminal, a first source terminal, a second source terminal, and a drain terminal;
   a resonator circuit that is connected to the gate terminal;
   a first transmission line short-circuiting stub that has a first line length and that is connected to one of the first source terminal and the second source terminal; and
   a second transmission line short-circuiting stub that is connected to the other of the first source terminal and the second source terminal and has a second line length which is different from the first line length of the first transmission line short-circuiting stub.

4. A second harmonic oscillator that has a series positive feedback configuration, suppresses output of a fundamental signal, and outputs a second harmonic signal having a frequency in a range from 1 GHz to 200 GHz which is generated inside a circuit, comprising:
   a field effect transistor having a gate terminal, a first source terminal, a second source terminal, and a drain terminal;
   a resonator circuit that is connected to one of the first source terminal and the second source terminal;

a first transmission line short-circuiting stub that has a first line length and that is connected to the gate terminal; and a second transmission line short-circuiting stub that is connected to the other of the first source terminal and the second source terminal and that has a second line length which is different from the first line length of the first transmission line short-circuiting stub.

5. The second harmonic oscillator according to claim 1, wherein one of the first line length of the first transmission line short-circuiting stub and the second line length of the second transmission line short-circuiting stub is a length obtained by adding one-fourth of one wavelength of the fundamental signal to an integer multiple of one-half wavelength of the fundamental signal.

6. The second harmonic oscillator according to claim 2, wherein one of the first line length of the first transmission line short-circuiting stub and the second line length of the second transmission line short-circuiting stub is a length obtained by adding one-fourth of one wavelength of the fundamental signal to an integer multiple of one-half wavelength of the fundamental signal.

7. The second harmonic oscillator according to claim 3, wherein one of the first line length of the first transmission line short-circuiting stub and the second line length of the second transmission line short-circuiting stub is a length obtained by adding one-fourth of one wavelength of the fundamental signal to an integer multiple of one-half wavelength of the fundamental signal.

8. The second harmonic oscillator according to claim 4, wherein one of the first line length of the first transmission line short-circuiting stub and the second line length of the second transmission line short-circuiting stub is a length obtained by adding one-fourth of one wavelength of the fundamental signal to an integer multiple of one-half wavelength of the fundamental signal.

9. The second harmonic oscillator according to claim 1, wherein one of load impedance of the second harmonic signal of the first transmission line shod-circuiting stub and load impedance of the second harmonic signal of the second transmission line short-circuiting stub has a real part that is in a range from 0 to +20Ω, and an imaginary part that is in a range from −20 to +20Ω.

10. The second harmonic oscillator according to claim 2, wherein one of load impedance of the second harmonic signal of the first transmission line short-circuiting stub and load impedance of the second harmonic signal of the second transmission line short-circuiting stub has a real part that is in a range from 0 to +20Ω, and an imaginary part that is in a range from −20 to 20Ω.

11. The second harmonic oscillator according to claim 3, wherein one of load impedance of the second harmonic signal of the first transmission line short-circuiting stub and load impedance of the second harmonic signal of the second transmission line short-circuiting stub has a real part that is in a range from 0 to +20Ω, and an imaginary part that is in a range from −20 to 20Ω.

12. The second harmonic oscillator according to claim 4, wherein one of load impedance of the second harmonic signal of the first transmission line short-circuiting stub and load impedance of the second harmonic signal of the second transmission line short-circuiting stub has a real pad that is in a range from 0 to +20Ω, and an imaginary part that is in a range from −20 to +20Ω.

* * * * *